(12) United States Patent
Ohsawa et al.

(10) Patent No.: US 8,895,870 B2
(45) Date of Patent: *Nov. 25, 2014

(54) PRINTED CIRCUIT BOARD AND METHOD OF MANUFACTURING THE SAME

(75) Inventors: Tetsuya Ohsawa, Ibaraki (JP); Mitsuru Honjo, Ibaraki (JP); Daisuke Yamuchi, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 324 days.

This patent is subject to a terminal disclaimer.

(21) Appl. No.: 12/862,338

(22) Filed: Aug. 24, 2010

(65) Prior Publication Data

US 2011/0048791 A1    Mar. 3, 2011

Related U.S. Application Data

(60) Provisional application No. 61/241,525, filed on Sep. 11, 2009.

(30) Foreign Application Priority Data

Aug. 28, 2009    (JP) .................................. 2009-198288

(51) Int. Cl.
| | |
|---|---|
| H05K 1/11 | (2006.01) |
| H05K 3/24 | (2006.01) |
| C25D 5/06 | (2006.01) |
| C25D 5/02 | (2006.01) |
| H05K 1/02 | (2006.01) |
| H05K 1/05 | (2006.01) |

(52) U.S. Cl.
CPC  *C25D 5/02* (2013.01); *H05K 3/242* (2013.01); *H05K 2201/09727* (2013.01); *C25D 5/06* (2013.01); *H05K 1/0237* (2013.01); *H05K 1/056* (2013.01)
USPC .......................................... 174/261; 174/257

(58) Field of Classification Search
CPC .......... C25D 5/02; C25D 5/06; H05K 1/0237; H05K 1/056; H05K 2201/09727; H05K 3/242
USPC .................................................... 174/255–267
See application file for complete search history.

(56) References Cited

U.S. PATENT DOCUMENTS

| 4,289,575 A | * | 9/1981 | Matsumoto et al. ............ 216/13 |
| 5,208,658 A | | 5/1993 | Murata |

(Continued)

FOREIGN PATENT DOCUMENTS

| JP | H03-245593 A | 11/1991 |
| JP | H05-48373 U | 6/1993 |

(Continued)

OTHER PUBLICATIONS

Office Action issued Dec. 11, 2012 in JP Application No. 2009-198288.

(Continued)

*Primary Examiner* — Yuriy Semenenko
(74) *Attorney, Agent, or Firm* — Panitch Schwarze Belisario & Nadel LLP (57) ABSTRACT

A plurality of wiring traces and a plurality of lead wires for plating are formed on a base insulating layer. Each wiring trace and each lead wire for plating are integrally formed with each other. An electrode pad is provided at an end of each wiring trace, and the lead wire for plating is provided to extend from each electrode pad toward the opposite side to the wiring trace. A width of each lead wire for plating is set larger than a width of each wiring trace.

4 Claims, 6 Drawing Sheets

(56) References Cited

U.S. PATENT DOCUMENTS

| | | | |
|---|---|---|---|
| 5,309,316 A | 5/1994 | Yagi et al. | |
| 6,493,190 B1 | 12/2002 | Coon | |
| 8,110,752 B2 * | 2/2012 | Nagaya et al. | 174/261 |
| 8,227,705 B2 * | 7/2012 | Ohsawa et al. | 174/261 |
| 2005/0247481 A1 * | 11/2005 | Chen et al. | 174/261 |
| 2006/0034018 A1 | 2/2006 | Deguchi et al. | |
| 2006/0223223 A1 | 10/2006 | Okazawa et al. | |
| 2007/0228509 A1 * | 10/2007 | Okada et al. | 257/503 |
| 2008/0075918 A1 * | 3/2008 | Ooyabu et al. | 428/138 |
| 2008/0084530 A1 * | 4/2008 | Hirabayashi et al. | 349/150 |
| 2008/0134500 A1 | 6/2008 | Ishii et al. | |
| 2008/0273269 A1 | 11/2008 | Pro | |
| 2009/0283314 A1 * | 11/2009 | Ohsawa et al. | 174/261 |
| 2012/0030939 A1 | 2/2012 | Ooyabu et al. | |

FOREIGN PATENT DOCUMENTS

| | | |
|---|---|---|
| JP | H11-340609 A | 12/1999 |
| JP | 2002-020898 A | 1/2002 |
| JP | 2005-340676 A | 12/2005 |
| JP | 2006-287034 A | 10/2006 |
| JP | 2008-085051 A | 4/2008 |
| JP | 2008-227376 A | 9/2008 |
| JP | 2008-282831 A | 11/2008 |
| JP | 2008282831 | * 11/2008 |

OTHER PUBLICATIONS

Office Action issued Dec. 30, 2013 in CN Application No. 201010266986.9.

Office Action issued Apr. 1, 2014 in JP Application No. 2013-167411.

Office Action issued Apr. 1, 2014 in JP Application No. 2013-167412.

Office Action issued Apr. 1, 2014 in JP Application No. 2013-167413.

Office Action issued Jul. 1, 2014 in JP Application No. 2013-167411.

Decision to grant a patent issued Jul. 1, 2014 in JP Application No. 2013-167412.

Office Action issued Jul. 1, 2014 in JP Application No. 2013-167413.

Office Action issued Sep. 1, 2014 in CN Application No. 201010266986.9.

* cited by examiner

PRINTED CIRCUIT BOARD AND METHOD OF MANUFACTURING THE SAME

CROSS-REFERENCE TO RELATED APPLICATIONS

This application claims priority from U.S. Provisional Patent Application No. 61/241,525, filed on Sep. 11, 2009, which is incorporated herein by reference in its entirety.

BACKGROUND OF THE INVENTION

1. Field of the Invention

The present invention relates to a printed circuit board and a method of manufacturing the same.

2. Description of the Background Art

Conductor traces are formed as wiring traces on a substrate by a subtractive method or the like in manufacture of a printed circuit board. Portions of the conductor traces are subjected to electrolytic plating, so that connection terminals are formed. Power feeding to the conductor traces is required for the electrolytic plating. Therefore, wiring portions for power feeding (hereinafter referred to as lead wires for plating) that extend from the portions at which the connection terminals are to be formed to one end of the substrate are formed during formation of the conductor traces. Power is fed to the conductor traces through the lead wires for plating.

According to JP 2006-287034 A, for example, in manufacture of a printed circuit board that is called a BGA (Ball Grid Array) used in a semiconductor device, upper surfaces of bonding pads of the conductor traces formed by the subtractive method are subjected to electrolytic nickel plating and electrolytic gold plating, so that the connection terminals are formed.

The lead wires for plating that extend from the bonding pads on the substrate to the one end of the substrate are electrically connected to an external electrode for plating, so that the power feeding is carried out. The upper surfaces of the bonding pads are subjected to the electrolytic nickel plating, and subsequently subjected to the electrolytic gold plating.

In the foregoing method, however, the lead wires for plating, which are unnecessary after the electrolytic plating, remain on the printed circuit board. When an electrical signal is transmitted through the conductor traces while another electronic circuit is connected to the connection terminals of the printed circuit board, the lead wires for plating become stubs branched from transmission lines. Resonance occurs at a particular frequency in such stubs. This causes a particular frequency component of the electrical signal to be attenuated. This may result in disadvantages such as a blunt waveform of the electrical signal.

Removing the lead wires for plating after the electrolytic plating is considered since the lead wires for plating are not necessary after the electrolytic plating. However, a process of removing the lead wires for plating is additionally required, thus leading to an increase in manufacturing cost.

BRIEF SUMMARY OF THE INVENTION

An object of the present invention is to provide a printed circuit board in which effects of a lead wire for plating to be exerted on a waveform of an electrical signal is reduced and a method of manufacturing the same.

(1) According to an aspect of the present invention, a printed circuit board includes an insulating layer, a wiring trace formed on the insulating layer, a terminal provided at a portion of the wiring trace, and a lead wire for plating formed on the insulating layer to extend from the wiring trace, wherein the lead wire for plating includes a first linear portion provided to extend from the wiring trace and having a first width, and a second linear portion provided to extend from the first linear portion and having a second width that is different from the first width.

In the printed circuit board, the wiring trace, the terminal provided at the portion of the wiring trace, and the lead wire for plating extending from the wiring trace are formed on the insulating layer. In this case, the first linear portion extending from the wiring trace and having the first width, and the second linear portion extending from the first linear portion and having the second width that is different from the first width are formed as the lead wire for plating.

When an electrical signal is transmitted through the wiring trace, a resonance frequency in the lead wire for plating is increased or decreased because the first width of the first linear portion and the second width of the second linear portion are different in the lead wire for plating.

This allows the resonance frequency in the lead wire for plating to be higher or lower than a frequency of the electrical signal transmitted through the wiring trace. Accordingly, effects of resonance in the lead wire for plating to be exerted on a waveform of the electrical signal can be reduced. This results in suppression of a blunt waveform of the electrical signal to be caused by the resonance in the lead wire for plating.

Even though the lead wire for plating has the limited length due to layout constraints of the printed circuit board, the length of the lead wire for plating is not adjusted while the first width and the second width of the lead wire for plating are set to the different values, thereby allowing the resonance frequency in the lead wire for plating to be higher or lower than the frequency of the electrical signal.

(2) The first width may be smaller than the second width. In this case, the resonance frequency in the lead wire for plating is decreased. This allows the resonance frequency in the lead wire for plating to be lower than the frequency of the electrical signal transmitted through the wiring trace. Accordingly, effects of the resonance in the lead wire for plating to be exerted on the waveform of the electrical signal can be reduced. This results in suppression of a blunt waveform of the electrical signal to be caused by the resonance in the lead wire for plating.

(3) The first width may be larger than the second width. In this case, the resonance frequency in the lead wire for plating is increased. This allows the resonance frequency in the lead wire for plating to be higher than the frequency of the electrical signal transmitted through the wiring trace. Accordingly, effects of the resonance in the lead wire for plating to be exerted on the waveform of the electrical signal can be reduced. This results in suppression of a blunt waveform of the electrical signal to be caused by the resonance in the lead wire for plating.

(4) According to another aspect of the present invention, a printed circuit board includes an insulating layer, a wiring trace formed on the insulating layer, a terminal provided at a portion of the wiring trace, and a lead wire for plating formed on the insulating layer to extend from the wiring trace, wherein the lead wire for plating is branched into a plurality of linear portions.

In the printed circuit board, the wiring trace, the terminal provided at the portion of the wiring trace, and the lead wire for plating extending from the wiring trace are formed on the insulating layer. In this case, the lead wire for plating is formed to branch into the plurality of linear portions.

When an electrical signal is transmitted through the wiring trace, the lead wire for plating is branched into the plurality of linear portions, thereby decreasing a resonance frequency in the lead wire for plating.

This allows the resonance frequency in the lead wire for plating to be lower than a frequency of the electrical signal transmitted through the wiring trace. Accordingly, effects of resonance in the lead wire for plating to be exerted on a waveform of the electrical signal can be reduced. This results in suppression of a blunt waveform of the electrical signal to be caused by the resonance in the lead wire for plating.

Even though the lead wire for plating has the limited length due to layout constraints of the printed circuit board, the length of the lead wire for plating is not adjusted while the lead wire for plating is branched, thereby allowing the resonance frequency in the lead wire for plating to be lower than the frequency of the electrical signal.

(5) The lead wire for plating may include a third linear portion extending from the wiring trace, and a plurality of fourth linear portions branched to extend from the third linear portion.

In this case, the resonance frequency in the lead wire for plating can be decreased while an increase in space for arranging the lead wire for plating can be suppressed.

(6) According to still another aspect of the present invention, a printed circuit board includes an insulating layer, a wiring trace formed on the insulating layer, a terminal provided at a portion of the wiring trace, and a lead wire for plating formed on the insulating layer to extend from the wiring trace, wherein a width of the lead wire for plating is larger than a width of the wiring trace.

In the printed circuit board, the wiring trace, the terminal provided at the portion of the wiring trace, and the lead wire for plating extending from the wiring trace are formed on the insulating layer. In this case, the width of the lead wire for plating is set larger than the width of the wiring trace.

When an electrical signal is transmitted through the wiring trace, a resonance frequency in the lead wire for plating is decreased because the width of the lead wire for plating is larger than the width of the wiring trace.

The width of the lead wire for plating is set such that the resonance frequency in the lead wire for plating is lower than a frequency of the electrical signal transmitted through the wiring trace, so that effects of resonance in the lead wire for plating to be exerted on a waveform of the electrical signal can be reduced. This results in suppression of a blunt waveform of the electrical signal to be caused by the resonance in the lead wire for plating.

Even though the lead wire for plating has the limited length due to layout constraints of the printed circuit board, the length of the lead wire for plating is not adjusted while the width of the lead wire for plating is made larger than the width of the wiring trace, thereby allowing the resonance frequency in the lead wire for plating to be lower than the frequency of the electrical signal.

(7) According to yet another aspect of the present invention, a method of manufacturing a printed circuit board includes the steps of forming a conductor pattern including a wiring trace, a terminal to be provided at a portion of the wiring trace, and a lead wire for plating extending from the wiring trace on an insulating layer, and forming a plating layer on the terminal by feeding power to the wiring trace through the lead wire for plating, wherein the step of forming the conductor pattern includes forming as the lead wire for plating a first linear portion extending from the wiring trace and having a first width, and a second linear portion extending from the first linear portion and having a second width that is different from the first width.

According to the method of manufacturing the printed circuit board, the conductor pattern including the wiring trace, the terminal to be provided at the portion of the wiring trace, and the lead wire for plating extending from the wiring trace are formed on the insulating layer. In this case, the first linear portion extending from the wiring trace and having the first width, and the second linear portion extending from the first linear portion and having the second width that is different from the first width are formed as the lead wire for plating. Power is fed to the wiring trace through the lead wire for plating, thereby forming the plating layer on the terminal.

When an electrical signal is transmitted through the wiring trace, a resonance frequency in the lead wire for plating is increased or decreased because the first width of the first linear portion and the second width of the second linear portion are different in the lead wire for plating in the printed circuit board manufactured in the foregoing manner.

This allows the resonance frequency in the lead wire for plating to be higher or lower than a frequency of the electrical signal transmitted through the wiring trace. Thus, effects of the resonance in the lead wire for plating to be exerted on a waveform of the electrical signal can be reduced. This results in suppression of a blunt waveform of the electrical signal to be caused by the resonance in the lead wire for plating.

Even though the lead wire for plating has the limited length due to layout constraints of the printed circuit board, the length of the lead wire for plating is not adjusted while the first width and the second width of the lead wire for plating are set to the different values, thereby allowing the resonance frequency in the lead wire for plating to be higher or lower than the frequency of the electrical signal.

(8) According to still another aspect of the present invention, a method of manufacturing a printed circuit board includes the steps of forming a conductor pattern including a wiring trace, a terminal to be provided at a portion of the wiring trace, and a lead wire for plating extending from the wiring trace on an insulating layer, and forming a plating layer on the terminal by feeding power to the wiring trace through the lead wire for plating, wherein the step of forming the conductor pattern includes branching the lead wire for plating into a plurality of linear portions.

According to the method of manufacturing the printed circuit board, the conductor pattern including the wiring trace, the terminal to be provided at the portion of the wiring trace, and the lead wire for plating extending from the wiring trace are formed on the insulating layer. In this case, the lead wire for plating is formed to be branched into the plurality of linear portions. Power is fed to the wiring trace through the lead wire for plating, thereby forming the plating layer on the terminal.

When the electrical signal is transmitted through the wiring trace, the lead wire for plating is branched into the plurality of linear portions, thereby decreasing a resonance frequency in the lead wire for plating in the printed circuit board manufactured in the foregoing manner.

This allows the resonance frequency in the lead wire for plating to be lower than a frequency of the electrical signal transmitted through the wiring trace. Accordingly, effects of resonance in the lead wire for plating to be exerted on a waveform of the electrical signal can be reduced. This results in suppression of a blunt waveform of the electrical signal to be caused by the resonance in the lead wire for plating.

Even though the lead wire for plating has the limited length due to layout constraints of the printed circuit board, the length of the lead wire for plating is not adjusted while the lead wire for plating is branched, so that the resonance frequency in the lead wire for plating can be made lower than the frequency of the electrical signal.

(9) According to yet another aspect of the present invention, a method of manufacturing a printed circuit board includes the steps of forming a conductor pattern including a wiring trace, a terminal to be provided at a portion of the wiring trace, and a lead wire for plating extending from the wiring trace on an insulating layer, and forming a plating layer on the terminal by feeding power to the wiring trace through the lead wire for plating, wherein the step of forming the conductor pattern includes making a width of the lead wire for plating larger than a width of the wiring trace.

According to the method of manufacturing the printed circuit board, the conductor pattern including the wiring trace, the terminal to be provided at the portion of the wiring trace, and the lead wire for plating extending from the wiring trace are formed on the insulating layer. In this case, the width of the lead wire for plating is set larger than the width of the wiring trace. Power is fed to the wiring trace through the lead wire for plating, thereby forming the plating layer on the terminal.

When an electrical signal is transmitted through the wiring trace, a resonance frequency in the lead wire for plating is decreased because the width of the lead wire for plating is larger than the width of the wiring trace in the printed circuit board manufactured in the foregoing manner.

The width of the lead wire for plating is set such that the resonance frequency in the lead wire for plating is lower than a frequency of the electrical signal transmitted through the wiring trace, so that effects of resonance in the lead wire for plating to be exerted on a waveform of the electrical signal can be reduced. This results in suppression of a blunt waveform of the electrical signal to be caused by the resonance in the lead wire for plating.

Even though the lead wire for plating has the limited length due to layout constraints of the printed circuit board, the length of the lead wire for plating is not adjusted while the width of the lead wire for plating is made larger than the width of the wiring trace, so that the resonance frequency in the lead wire for plating can be made lower than the frequency of the electrical signal.

According to the present invention, effects of the resonance in the lead wire for plating to be exerted on the waveform of the electrical signal can be reduced. This results in suppression of a blunt waveform of the electrical signal to be caused by the resonance in the lead wire for plating.

Other features, aspectselements, characteristics, and advantages of the present invention will become more apparent from the following detailed description of preferred embodiments of the present invention when taken in conjunction with the accompanying reference to the attached drawings.

DETAILED DESCRIPTION OF THE INVENTION

Description will be made of a printed circuit board and a method of manufacturing the same according to an embodiment of the present invention while referring to the drawings. In the embodiment below, a suspension board used for reading and writing from and in a hard disk is described as one example of the printed circuit board.

(1) Configuration of the Suspension Board

Figure 1:
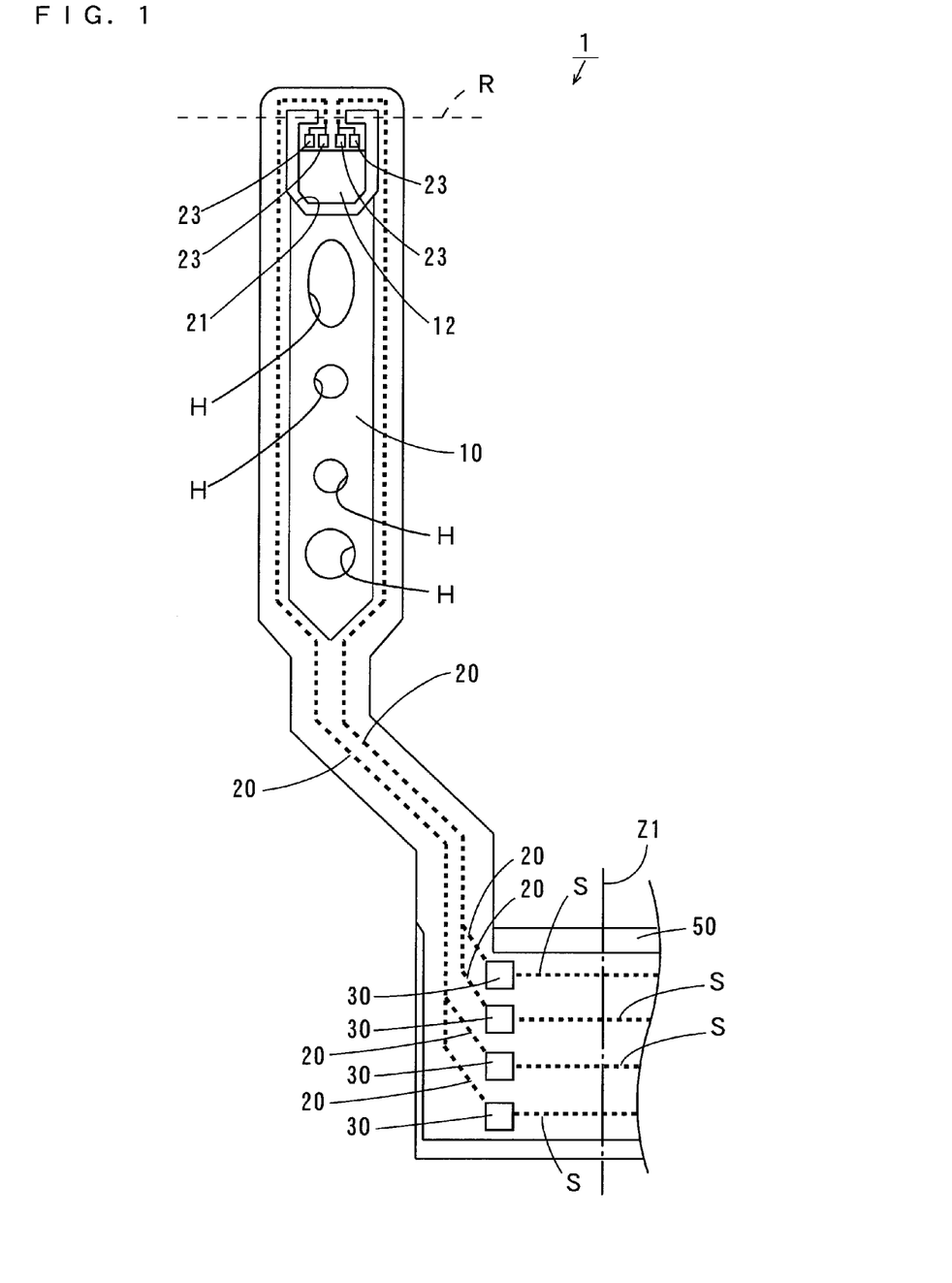
FIG. 1 is a top view of a suspension board.

FIG. 1 is a top view of the suspension board according to the embodiment of the present invention. As shown in FIG. 1, the suspension board 1 includes a suspension body 10 formed of a long-sized metal substrate. A plurality of holes H are formed in the suspension body 10. A plurality of wiring traces 20 are formed on the suspension body 10. Each wiring trace 20 is provided with electrode pads 23, 30 at its one end and other end, respectively.

At the tip of the suspension body 10, a U-shaped opening 21 is formed, thereby providing a magnetic head supporting portion (hereinafter referred to as a tongue) 12. The tongue 12 is bent along the broken line R to form a given angle with respect to the suspension body 10. The plurality of electrode pads 23 are formed at an end of the tongue 12.

A magnetic head (not shown) that performs reading and writing from and in the hard disk is mounted on the tongue 12. Terminals of the magnetic head are connected to the plurality of electrode pads 23, respectively.

The plurality of electrode pads 30 are formed at the other end of the suspension body 10. A plurality of lead wires S for plating are formed to extend from the plurality of electrode pads 30 toward the opposite side to the wiring traces 20.

In the manufacture, a plurality of suspension boards 1 are formed at the same time in a metal support substrate 50, and each suspension board 1 is then separated from other regions of the support substrate 50. In this case, the suspension body 10 is formed of part of the support substrate 50.

The plurality of lead wires S for plating of each suspension board 1 extend to a region on the support substrate 50 outside the suspension board 1 to be connected to power feed terminals that are not shown. After each suspension board 1 is completed, each suspension body 10 is separated from the other regions of the support substrate 50 at the one-dot and dash line Z1.

Figure 2:
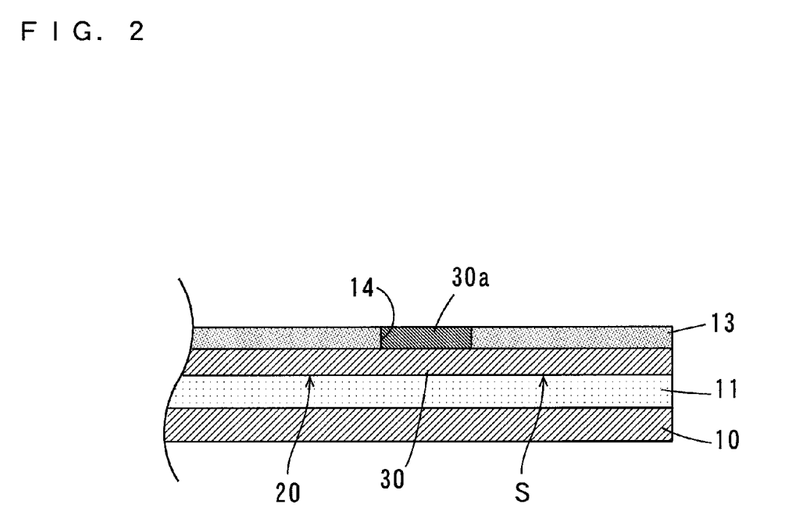
FIG. 2 is a schematic vertical sectional view of a lead wire for plating and peripheral portions thereof.
Figure 3:
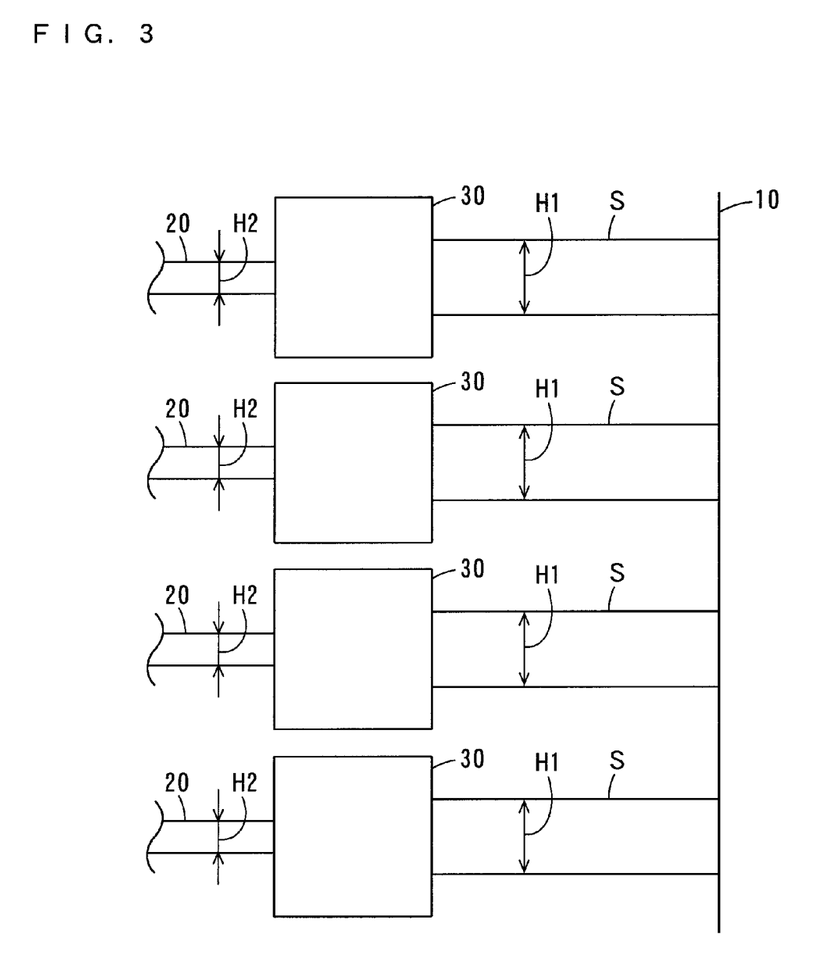
FIG. 3 is an enlarged plan view of lead wires for plating and peripheral portions thereof.

FIG. 2 is a schematic vertical sectional view of the lead wire S for plating and peripheral portions thereof. FIG. 3 is an enlarged plan view of the lead wires S for plating and peripheral portions thereof.

As shown in FIG. 2, a base insulating layer 11 made of polyimide, for example, is formed on the suspension body 10 made of stainless steel (SUS), for example.

The plurality of wiring traces 20 and the plurality of lead wires S for plating made of copper, for example, are formed on the base insulating layer 11. FIG. 2 only shows one wiring trace 20 and one lead wire S for plating.

Each wiring trace 20 and each lead wire S for plating are integrally formed with each other. In this case, the electrode pad 30 is provided at an end of each wiring trace 20, and the lead wire S for plating is provided to extend from each electrode pad 30 toward the opposite side to the wiring trace 20.

A cover insulating layer 13 made of polyimide, for example, is formed on the base insulating layer 11 to cover the plurality of lead wires S for plating and the plurality of wiring traces 20.

A hole 14, which reaches an upper surface of the electrode pad 30, is formed in a portion of the cover insulating layer 13 above the electrode pad 30 of each wiring trace 20. A plating layer 30a made of gold, for example, is formed to fill each hole 14.

As shown in FIG. 3, a width H1 of each lead wire S for plating is set larger than a width H2 of each wiring trace 20. The width H1 of each lead wire S for plating is preferably more than one time and not more than ten times the width H2 of each wiring trace 20. When the widths of the wiring traces 20 are not uniform, the width H2 of the wiring trace 20 refers to the minimum value of the width of the wiring trace 20.

(2) Method of Manufacturing the Suspension Board

Description will be made of a method of manufacturing the suspension board 1 according to the present embodiment. Here, the steps of forming the tongue 12, the plurality of electrode pads 23 and the holes H of FIG. 1 are not described.

Figure 4:
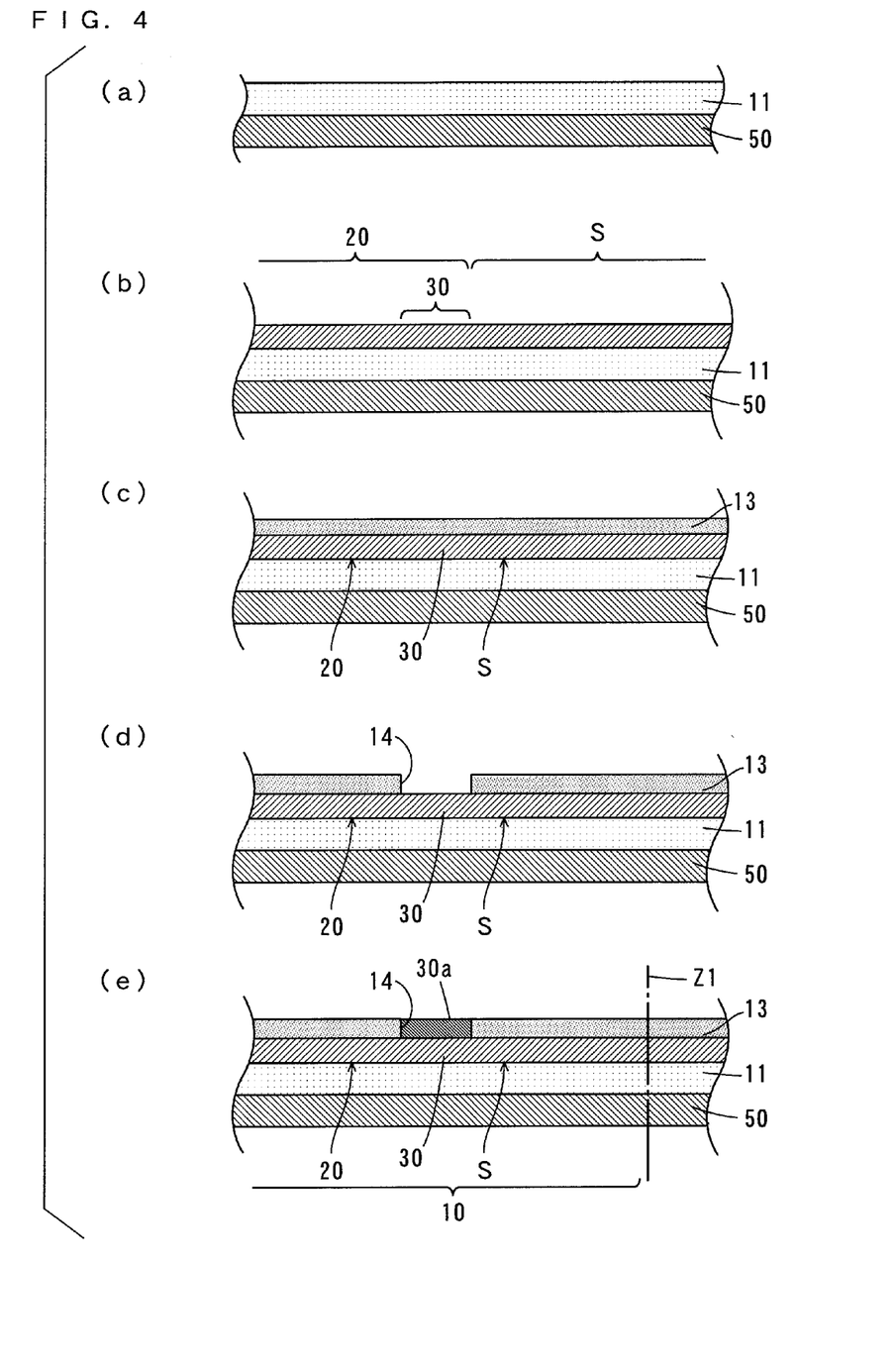
FIG. 4 is a schematic sectional view for illustrating manufacturing steps of the suspension board.

FIG. 4 is a schematic sectional view for illustrating manufacturing steps of the suspension board 1 according to the embodiment of the present invention. FIG. 4 shows the manufacturing steps in the cross section at the same portion as that shown in FIG. 2.

First, the support substrate 50 made of stainless steel (SUS), for example, is prepared. The base insulating layer 11 made of polyimide, for example, is subsequently formed on the support substrate 50 as shown in FIG. 4 (a).

Another material such as aluminum instead of stainless steel may be used as the material for the support substrate 50. The thickness of the support substrate 50 is preferably not less than 5 µm and not more than 200 µm, and more preferably not less than 10 µm and not more than 50 µm.

Another insulating material such as epoxy instead of polyimide may be used as the material for the base insulating layer 11. The thickness of the base insulating layer 11 is preferably not less than 1 µm and not more than 100 µm, and more preferably not less than 2 µm and not more than 25 µm.

Next, the plurality of (one of them is shown FIG. 4) wiring traces 20 and the plurality of (one of them is shown FIG. 4) lead wires S for plating made of copper, for example, are formed on the base insulating layer 11 as shown in FIG. 4 (b). In this case, the electrode pad 30 is provided at the end of each wiring trace 20, and the lead wire S for plating is provided to extend from each electrode pad 30 toward the opposite side to the wiring trace 20.

The wiring traces 20 and the lead wires S for plating may be formed using a semi-additive method, for example, and may be formed using another method such as a subtractive method. Another metal such as gold and aluminum or an alloy such as a copper alloy and an aluminum alloy instead of copper may be used as the material for the wiring traces 20 and the lead wires S for plating.

The thickness of each of the wiring traces 20 and the lead wires S for plating is preferably not less than 2 µm and not more than 100 µm, and more preferably not less than 3 µm and not more than 25 µm, for example. The width of each of the wiring traces 20 is preferably not less than 5 µm and not more than 1000 µm, and more preferably not less than 10 µm and not more than 250 µm, for example. The width of each of the lead wires S for plating is preferably not less than 5 µm and not more than 1000 µm, and more preferably not less than 10 µm and not more than 250 µm, for example.

The cover insulating layer 13 made of polyimide, for example, is then formed on the base insulting layer 11 to cover the plurality of wiring traces 20 and the plurality of lead wires S for plating as shown in FIG. 4 (c). Another material such as epoxy instead of polyimide may be used as the material for the cover insulating layer 13.

The hole 14 that reaches the upper surface of the electrode pad 30 is subsequently formed in the portion of the cover insulating layer 13 above the electrode pad 30 of each wiring trace 20 by etching or laser machining, for example, as shown in FIG. 4 (d).

Then, the plating layer 30a made of gold, for example, is formed by electrolytic plating to fill the hole 14 as shown in FIG. 4 (e). In this case, power is fed for the electrolytic plating through the lead wire S for plating. After the plating layer 30a is formed, the support substrate 50, the base insulating layer 11, the lead wires S for plating and the cover insulating layer 13 are cut off at the one-dot and dash line Z1. In this manner, the suspension board 1 having the suspension body 10 is completed.

(3) Bonding of the Suspension Board and the FPC Board

The plurality of electrode pads 30 of the suspension board 1 are bonded to terminals of another printed circuit board (a flexible printed circuit board, for example). Hereinafter, description is made of an example of bonding of the electrode pads 30 of the suspension board 1 and the terminals of the flexible printed circuit board (hereinafter referred to as the FPC board).

Figure 5:
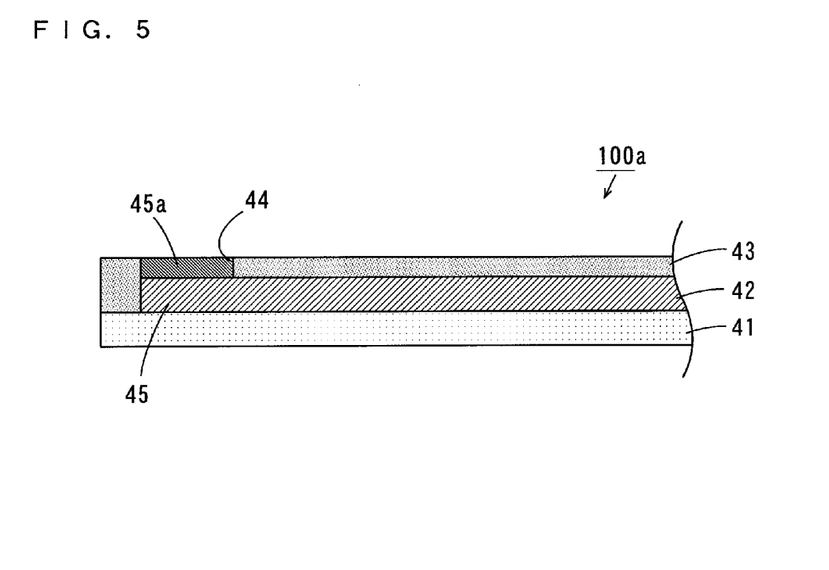
FIG. 5 is a schematic sectional view of an FPC board.
Figure 6:
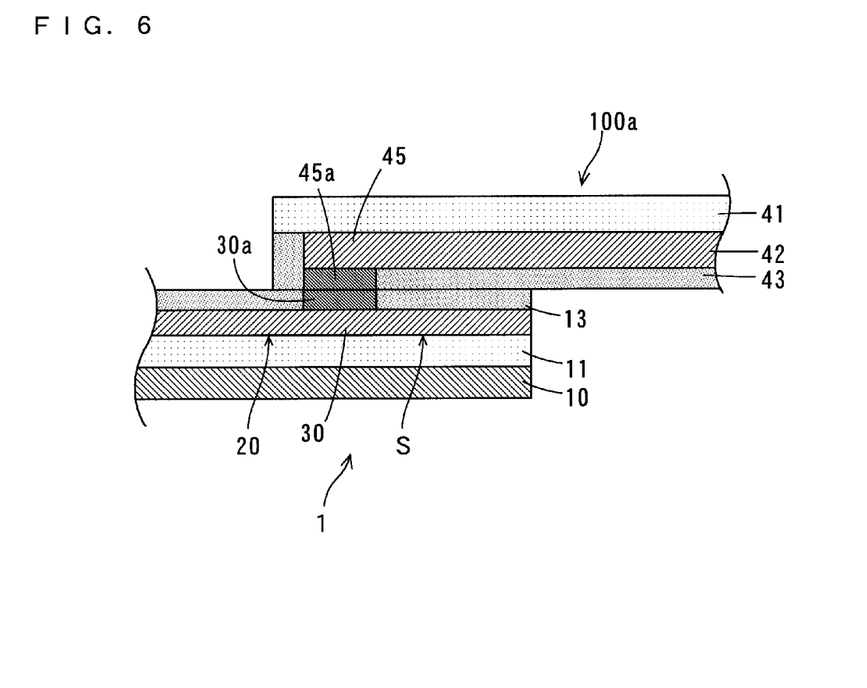
FIG. 6 is a schematic sectional view showing a connection state between an electrode pad of the suspension board and a terminal of the FPC board.

FIG. 5 is a schematic sectional view of the FPC board, and FIG. 6 is a schematic sectional view showing a connection state between the electrode pad 30 of the suspension board 1 and the terminal of the FPC board. In FIG. 6, the FPC board of FIG. 5 is turned upside down.

As shown in FIG. 5, the FPC board 100a includes a base insulating layer 41 made of polyimide, for example. A plurality of wiring traces 42 made of copper, for example, are formed on the base insulating layer 41. FIGS. 5 and 6 show only one of the wiring traces 42.

A terminal 45 is formed at an end of each wiring trace 42. A cover insulating layer 43 made of polyimide, for example, is formed on the base insulating layer 41 to cover the plurality of wiring traces 42. A hole 44 is formed in a portion of the cover insulating layer 43 above the terminal 45 of each wiring trace 42. A plating layer 45a made of gold, for example, is formed to fill each hole 44.

As shown in FIG. 6, the suspension board 1 and the FPC board 100a are arranged such that the electrode pad 30 of the suspension board 1 and the terminal 45 of the FPC board 100a are in contact with each other, and the electrode pad 30 (the plating layer 30a) and the terminal 45 (the plating layer 45a) are bonded to each other using ultrasonic waves or solder, for example.

(4) Attenuation of Frequency Component Caused by the Lead Wires S for Plating

Here, description is made of attenuation of a frequency component caused by the lead wires S for plating at the time of transmission of an electrical signal between the suspension board 1 and the FPC board 100a.

When the electrical signal is transmitted through the wiring traces 20 of the suspension board 1 and the wiring traces 42 of the FPC board 100a, the wiring traces 20 and the wiring traces 42 become transmission paths, and the lead wires S for plating become stubs that are branched from the transmission paths.

In this case, resonance occurs at a particular frequency in the stubs. This causes a component of a resonance frequency of the electrical signal transmitted through the transmission paths to be attenuated.

A digital signal includes a plurality of frequency components. For example, the digital signal composed of rectangular waves includes a plurality of frequency components that are an integral multiple of the frequency. Therefore, when the particular frequency component included in the digital signal is attenuated, a waveform of the digital signal becomes blunt, and inclinations of a rising edge and a falling edge become moderate.

In the present embodiment, the width H1 (FIG. 3) of the lead wire S for plating is set larger than the width H2 (FIG. 3) of the wiring trace 20. In this case, the resonance frequency in the lead wire S for plating is decreased as compared with a case where the width H1 of the lead wire S for plating is equal to the width H2 of the wiring trace 20.

The width H1 of the lead wire S for plating is set such that the resonance frequency in the lead wire S for plating is lower than the frequency of the electrical signal transmitted through the wiring traces 20 in the present embodiment.

(5) Effects of the Present Embodiment

The width H1 of the lead wire S for plating is set larger than the width H2 of the wiring trace 20, so that the resonance frequency in the lead wire S for plating is decreased as compared with the case where the width H1 of the lead wire S for plating is equal to the width H2 of the wiring trace 20 in the suspension board 1 according to the present embodiment. The resonance frequency in the lead wire S for plating is made lower than the frequency of the electrical signal by increasing the width H1 of the lead wire S for plating, so that effects of the resonance in the lead wire S for plating to be exerted on the waveform of the electrical signal can be reduced. This results in suppression of a blunt waveform of the electrical signal to be caused by the resonance in the lead wires S for plating.

Even though the lead wire S for plating has the limited length due to layout constraints of the suspension board 1, the length of the lead wire S for plating is not adjusted while the width H1 of the lead wire S for plating is adjusted, so that the resonance frequency in the lead wire S for plating can be made lower than the frequency of the electrical signal.

(6) Other Examples of the Lead Wire for Plating

Instead of the lead wire S for plating, lead wires for plating, described below, may be provided in the foregoing suspension board 1.

(6-1)

Figure 7:
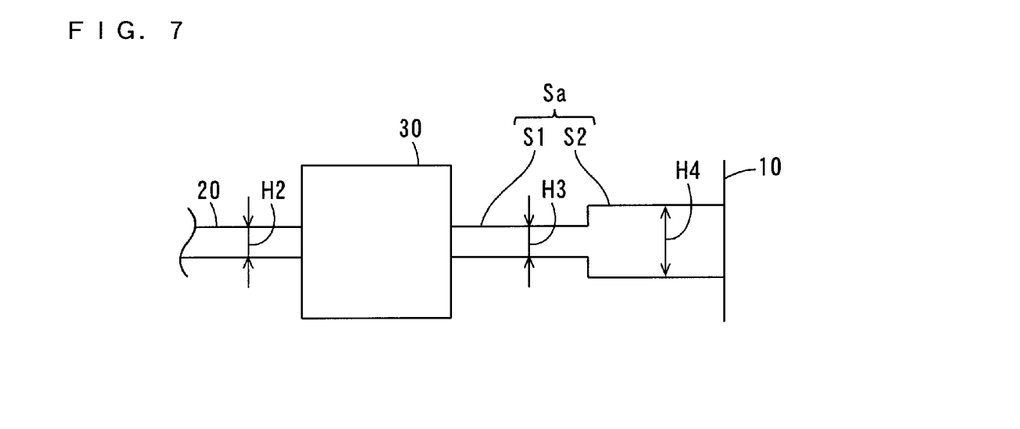
FIG. 7 is an enlarged plan view of a lead wire for plating and peripheral portions thereof.

FIG. 7 is an enlarged plan view of a lead wire Sa for plating and peripheral portions thereof. FIG. 7 only shows one of a plurality of lead wires Sa for plating.

As shown in FIG. 7, the lead wire Sa for plating is composed of linear portions S1, S2 that are integrally formed with each other. The linear portion S1 is provided to extend a given length from the electrode pad 30 toward the opposite side to the wiring trace 20. The linear portion S2 is provided to extend from an end of the first linear portion S1 to the end of the suspension body 10.

A width H4 of the linear portion S2 is set larger than a width H3 of the linear portion S1. The width H4 of the linear portion S2 is not less than 1.1 times and not more than 10 times the width H3 of the linear portion S1, and preferably not less than 1.5 times and not more than 8 times, for example.

A ratio of the length of the linear portion S2 to the entire length of the lead wire Sa for plating is not less than 0.1 and not more than 0.9, and preferably not less than 0.2 and not more than 0.8, for example.

The width H4 of the linear portion S2 is set larger than the width H3 of the linear portion S1 in the lead wire Sa for plating, so that the resonance frequency in the lead wire Sa for plating is decreased as compared with a case where the width H4 of the linear portion S2 is equal to the width H3 of the linear portion S1. In this case, the resonance frequency in the lead wire Sa for plating is made lower than the frequency of the electrical signal by making the width H4 of the linear portion S2 larger than the width H3 of the linear portion S1 in the lead wire Sa for plating, so that effects of the resonance in the lead wire Sa for plating to be exerted on the waveform of the electrical signal can be reduced. This results in suppression of a blunt waveform of the electrical signal to be caused by the resonance in the lead wires S for plating.

Even though the lead wire Sa for plating has the limited length due to layout constraints of the suspension board 1, the length of the lead wire Sa for plating is not adjusted while the widths H3, H4 of the linear portions S1, S2 are adjusted, so that the resonance frequency in the lead wire Sa for plating can be made lower than the frequency of the electrical signal.

(6-2)

Figure 8:
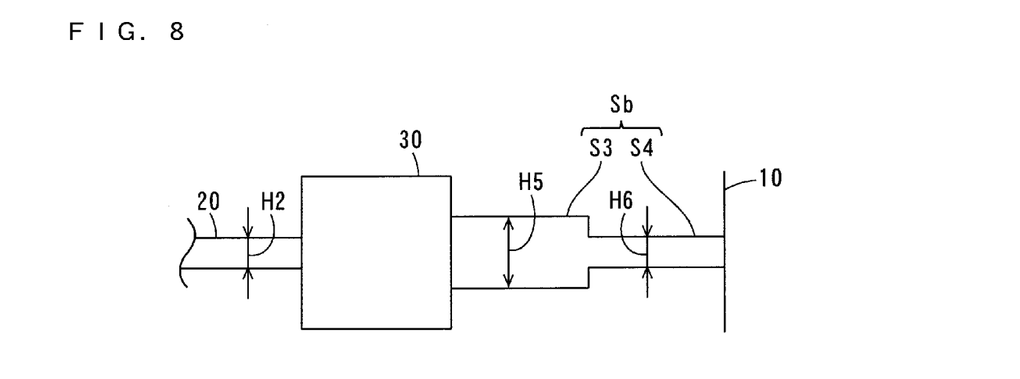
FIG. 8 is an enlarged plan view of a lead wire for plating and peripheral portions thereof.

FIG. 8 is an enlarged plan view of a lead wire Sb for plating and peripheral portions thereof. FIG. 8 only shows one of a plurality of lead wires Sb for plating.

As shown in FIG. 8, the lead wire Sb for plating is composed of linear portions S3, S4 that are integrally formed with each other. The linear portion S3 is provided to extend a given length from the electrode pad 30 toward the opposite side to the wiring trace 20. The linear portion S4 is provided to extend from an end of the linear portion S3 to the end of the suspension body 10.

A width H5 of the linear portion S3 is set larger than a width H6 of the linear portion S4. The width H5 of the linear portion S3 is not less than 1.1 times and not more than 10 times the width H6 of the linear portion S4, and preferably not less than 1.5 times and not more than 8 times, for example.

A ratio of the length of the linear portion S3 to the entire length of the lead wire Sb for plating is not less than 0.1 and not more than 0.9, and preferably not less than 0.2 and not more than 0.8, for example.

The width H5 of the linear portion S3 is set larger than the width H6 of the linear portion S4 in the lead wire Sb for plating, so that the resonance frequency in the lead wire Sb for plating is increased as compared with a case where the width H5 of the linear portion S3 is equal to the width H6 of the linear portion S4. In this case, the resonance frequency in the lead wire Sb for plating is made higher than the frequency of the electrical signal by making the width H5 of the linear portion S3 larger than the width H6 of the linear portion S4 in the lead wire Sb for plating, so that effects of the resonance in the lead wire Sb for plating to be exerted on the waveform of the electrical signal can be reduced. This results in suppression of a blunt waveform of the electrical signal to be caused by the resonance in the lead wires Sb for plating.

Even though the lead wire Sb for plating has the limited length due to layout constraints of the suspension board 1, the length of the lead wire Sb for plating is not adjusted while the widths H5, H6 of the linear portions S3, S4 are adjusted, thereby allowing the resonance frequency in the lead wire Sb for plating to be higher than the frequency of the electrical signal.

(6-3)

Figure 9:
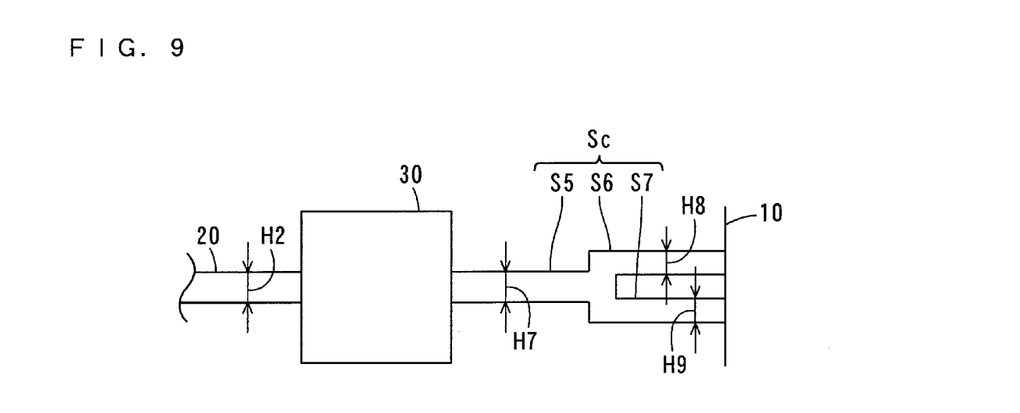
FIG. 9 is an enlarged plan view of a lead wire for plating and peripheral portions thereof.

FIG. 9 is an enlarged plan view of a lead wire Sc for plating and peripheral portions thereof. FIG. 9 only shows one of a plurality of lead wires Sc for plating.

As shown in FIG. 9, the lead wire Sc for plating is composed of linear portions S5, S6, S7 that are integrally formed with one another. The linear portion S5 is provided to extend a given length from the electrode pad 30 toward the opposite side to the wiring trace 20. Each of the linear portions S6, S7 is provided to extend from an end of the linear portion S5 to the end of the suspension body 10.

A ratio of the length of the linear portion S5 to the entire length of the lead wire Sc for plating (the sum of the lengths of the linear portions S5, S6, S7) is not less than 0.1 and not more than 0.9, and preferably not less than 0.2 and not more than 0.8, for example. The linear portions S6, S7 preferably have the same lengths.

The linear portion S5 of the lead wire Sc for plating is branched into the linear portions S6, S7, so that the resonance frequency in the lead wire Sc for plating is decreased as compared with a case where the lead wire Sc for plating is not branched. In this case, the resonance frequency in the lead wire Sc for plating is made lower than the frequency of the electrical signal by branching the linear portion S5 of the lead wire Sc for plating into the linear portions S6, S7, so that effects of the resonance in the lead wire Sc for plating to be exerted on the waveform of the electrical signal can be reduced. This results in suppression of a blunt waveform of the electrical signal to be caused by the resonance in the lead wires Sc for plating.

Even though the lead wire Sc for plating has the limited length due to layout constraints of the suspension board 1, the length of the lead wire Sc for plating is not adjusted while the lead wire Sc for plating is branched, so that the resonance frequency in the lead wire Sc for plating can be made lower than the frequency of the electrical signal.

(7) Inventive Examples and Comparative Examples

Effects of the resonance in the lead wires for plating exerted on the electrical signal were found by simulations. In this case, it was assumed that the electrical signal was transmitted through the wiring traces 20 while the suspension body 10 was not provided and only the wiring traces 20 made of copper and the lead wires S (Sa to Sd) for plating made of copper were provided on the base insulating layer 11 made of polyimide.

In the inventive examples 1 to 7 and the comparative examples 1, 2 described below, the thickness of the base insulating layer 11 was 20 μm, and the thickness of the wiring trace 20 was 12 μm, and the width H2 of the wiring trace 20 was 100 μm.

(7-1) Inventive Example 1

Suppose that the lead wires S for plating of FIG. 3 were provided in the inventive example 1.

The thickness of the lead wire S for plating was 12 μm, the width H1 of the lead wire S for plating was 300 μm, and the length of the lead wire S for plating was 4800 μm in the inventive example 1.

(7-2) Inventive Example 2

Suppose that the lead wires Sa for plating of FIG. 7 were provided in the inventive example 2.

The thickness of the lead wire Sa for plating was 12 μm, the width H3 of the linear portion S1 was 100 μm, the width H4 of the linear portion S2 was 300 μm, the length of the linear portion S1 was 2400 μm, and the length of the linear portion S2 was 2400 μm in the inventive example 2.

(7-3) Inventive Examples 3 to 5

Suppose that the lead wires Sb for plating of FIG. 8 were provided in the inventive examples 3 to 5.

The thickness of the lead wire Sb for plating was 12 μm, the width H5 of the linear portion S3 was 300 μm, and the width H6 of the linear portion S4 was 100 μm in the inventive examples 3 to 5.

The length of the linear portion S3 was 2400 μm, and the length of the linear portion S4 was 2400 μm in the inventive example 3. The length of the linear portion S3 was 1200 μm, and the length of the linear portion S4 was 3600 μm in the inventive example 4. The length of the linear portion S3 was 600 μm, and the length of the linear portion S4 was 4200 μm in the inventive example 5.

(7-4) Inventive Examples 6, 7

Suppose that the lead wires Sc for plating of FIG. 9 were provided in the inventive examples 6, 7.

The thickness of the lead wire Sc for plating was 12 μm, a width H7 of the linear portion S5 was 100 μm, a width H8 of the linear portion S6 was 100 μm, and a width H9 of the linear portion S7 was 100 μm in the inventive examples 6, 7.

The length of the linear portion S5 was 2400 μm, the length of each of the linear portions S6, S7 was 2400 μm in the inventive example 6. The length of the linear portion S5 was 3600 μm, the length of each of the linear portions S6, S7 was 1200 μm in the inventive example 7.

(7-5) Comparative Examples

Suppose that the comparative examples employ the same configuration as that employed in the inventive example 1 except that the lead wires for plating each having the same width as the wiring trace 20 were provided instead of the lead wires S for plating.

(7-6) Evaluation of the Inventive Examples 1 to 7 and the Comparative Examples

Transmission of the electrical signal in the inventive examples 1 to 7 and the comparative examples was found by simulations.

Note that the length of each lead wire S for plating of the inventive example 1, the length of each lead wire Sa for plating (the sum of the lengths of the linear portions S1, S2) of the inventive example 2, the length of each lead wire Sb for plating (the sum of the lengths of the linear portions S3, S4) of the inventive examples 3 to 5, the length of each lead wire Sc for plating (the sum of the lengths of the linear portions S5, S6 (S7)) of the inventive examples 6, 7, and the length of each lead wire for plating of the comparative examples are equal.

Results of the simulations show that significant attenuation of the electrical signal occurred at about 9.4 GHz in the inventive example 1, at about 6.7 GHz in the inventive example 2, at about 12.2 GHz in the inventive example 3, at about 11.2 GHz in the inventive example 4, at about 10.4 GHz in the inventive example 5, at about 7.4 GHz in the inventive example 6, and at about 7.7 GHz in the inventive example 7 as respective peaks. On the other hand, significant attenuation of the electrical signal occurred at about 9.6 GHz as a peak in the comparative examples.

In the inventive examples 1, 2, 6, 7, the significant attenuation of the electrical signal occurred in lower frequency regions than in the comparative examples. In the inventive examples 3 to 5, the significant attenuation of the electrical signal occurred in higher frequency regions than in the comparative examples.

The results show that when the width H1 of the lead wire S for plating was larger than the width H2 of the wiring trace 20, the significant attenuation of the electrical signal occurred in the lower frequency regions than that when the width H1 of the lead wire S for plating was equal to the width H2 of the wiring trace 20.

It was found that when the width H4 of the linear portion S2 was set larger than the width H3 of the linear portion S1 in the lead wire Sa for plating, the significant attenuation of the electrical signal occurred in the lower frequency regions than that when the width H4 of the linear portion S2 is equal to the width H3 of the linear portion S1.

It was found that when the width H6 of the linear portion S4 was set larger than the width H5 of the linear portion S3 in the lead wire Sb for plating, the significant attenuation of the electrical signal occurred in the higher frequency regions than that when the width H6 of the linear portion S4 is equal to the width H5 of the linear portion S3.

It was found that when the lead wire Sc for plating was branched into the linear portions S6, S7, the significant attenuation of the electrical signal occurred in the lower frequency regions than that when the lead wire Sc for plating is not branched.

The results of these show that effects of the resonance in the lead wires for plating exerted on the waveform of the electrical signal can be reduced in the given frequency region (about 9.6 GHz in this example).

(8) Correspondences Between Elements in the Claims and Parts in Embodiments

In the following paragraph, non-limiting examples of correspondences between various elements recited in the claims below and those described above with respect to various preferred embodiments of the present invention are explained.

In the above-described embodiment, the base insulating layer 11 is an example of an insulating layer, the electrode pad 30 is an example of a terminal, the suspension board 1 is an example of a printed circuit board, the widths H3, H5 are examples of a first width, the linear portions S1, S3 are examples of a first linear portion, the widths H4, H6 are examples of a second width, the linear portions S2, S4 are examples of a second linear portion, the linear portion S5 is an example of a third linear portion, and the linear portions S6, S7 are examples of a fourth linear portion.

As each of various elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

We claim:

1. A printed circuit board comprising:
a suspension body;
an insulating layer formed on said suspension body;
a plurality of wiring traces formed on said insulating layer;
a first terminal provided at one end of each of said plurality of wiring traces;
a second terminal provided at another end of each of said plurality of wiring traces; and
a plurality of lead wires for plating formed on said insulating layer, one of said plurality of lead wires extending from each first terminal of said plurality of wiring traces,
wherein the plurality of lead wires for plating are not connected to one another and each of said plurality of lead wires for plating includes:
a first linear portion extending from each first terminal and having a first width; and
a second linear portion extending from said first linear portion and having a second width that is smaller than said first width.

2. A printed circuit board comprising:
a suspension body;
an insulating layer formed on said suspension body;
a wiring trace formed on said insulating layer;
a terminal provided at a portion of said wiring trace; and
a lead wire for plating formed on said insulating layer and extending from said wiring trace,
wherein said lead wire for plating includes:
a first linear portion extending from said wiring trace and having a first width; and
a second linear portion extending from said first linear portion and having a second width that is different from said first width,
wherein said first width is smaller than said second width.

3. A printed circuit board comprising:
a suspension body;
an insulating layer formed on said suspension body;
a plurality of wiring traces formed on said insulating layer;
a first electrode pad provided at one end of each of said plurality of wiring traces;
a second electrode pad provided at another end of each of said plurality of wiring traces; and
a plurality of lead wires for plating formed on said insulating layer, one of said plurality of lead wires extending from each first electrode pad of said plurality of wiring traces,
wherein the plurality of lead wires for plating are not connected to one another and each lead wire for plating includes a first linear portion extending from each first electrode pad,
wherein the first linear portion branches into a plurality of second linear portions, each of the second linear portions extending from an end of said first linear portion that is distant from said first electrode pad to an outer edge of said insulating layer.

4. A printed circuit board comprising:
a suspension body;
a base insulating layer;
a plurality of wiring traces formed on said base insulating layer;
a first electrode pad provided at one end of each of said plurality of wiring traces;
a second electrode pad provided at another end of each of said plurality of wiring traces;
a plurality of lead wires for plating formed on said base insulating layer, one of said plurality of lead wires extending from each first electrode pad of said plurality of wiring traces; and
a cover insulating layer provided to cover said plurality of lead wires for plating,
wherein the plurality of lead wires for plating are not connected to one another, and
wherein each of said plurality of lead wires for plating has a uniform width along a length extending from each first electrode pad to an edge of the suspension body, the uniform width of each of said plurality of lead wires for plating being larger than a width of each of said plurality of wiring traces.

* * * * *